(12) United States Patent
You et al.

(10) Patent No.: US 12,144,257 B2
(45) Date of Patent: Nov. 12, 2024

(54) HEAT DISSIPATION COMPOSITE, LOWER PANEL SHEET, AND DISPLAY DEVICE INCLUDING THE SAME

(71) Applicant: Samsung Display Co., Ltd., Yongin-si (KR)

(72) Inventors: Jun Woo You, Seongnami-si (KR); Jeong In Lee, Hwaseong-si (KR); Hyuk Hwan Kim, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 512 days.

(21) Appl. No.: 17/381,655

(22) Filed: Jul. 21, 2021

(65) Prior Publication Data

US 2022/0045263 A1 Feb. 10, 2022

(30) Foreign Application Priority Data

Jul. 22, 2020 (KR) .................. 10-2020-0090821

(51) Int. Cl.
*H10N 30/20* (2023.01)
*G06F 1/20* (2006.01)
*H10N 10/17* (2023.01)

(52) U.S. Cl.
CPC ............... *H10N 30/20* (2023.02); *G06F 1/20* (2013.01); *H10N 10/17* (2023.02)

(58) Field of Classification Search
CPC ....... H01L 23/38; H10N 30/20; H10N 19/101
See application file for complete search history.

(56) References Cited

U.S. PATENT DOCUMENTS

| 5,419,780 A * | 5/1995 | Suski .................... | H10N 10/13 136/224 |
|---|---|---|---|
| 2002/0074646 A1 * | 6/2002 | Saika ..................... | H01L 23/38 257/E23.102 |
| 2010/0224226 A1 * | 9/2010 | Feng ...................... | H10N 10/17 136/224 |
| 2012/0042661 A1 * | 2/2012 | Danenberg ............. | H10N 10/17 62/3.2 |
| 2012/0118346 A1 * | 5/2012 | Liu ......................... | H10N 10/17 438/54 |
| 2012/0133210 A1 * | 5/2012 | Moon ..................... | H10N 10/00 136/224 |
| 2012/0298165 A1 * | 11/2012 | Kurihara .............. | H10N 30/088 29/25.35 |

(Continued)

FOREIGN PATENT DOCUMENTS

| CN | 109346498 | 2/2019 | |
|---|---|---|---|
| CN | 111356346 A * | 6/2020 | ............... H02N 1/04 |

(Continued)

OTHER PUBLICATIONS

JP-2002151873-A English machine translation (Year: 2002).*
CN-111356346-A English machine translation (Year: 2020).*

*Primary Examiner* — Andrew J Golden
(74) *Attorney, Agent, or Firm* — CANTOR COLBURN LLP

(57) ABSTRACT

A heat dissipation composite for a display device includes: a heat absorber; an electricity generator disposed on the heat absorber to convert heat from the heat absorber into electricity; and a vibrator disposed on the electricity generator to convert the electricity provided from the electricity generator into vibration.

14 Claims, 25 Drawing Sheets

(56) References Cited

U.S. PATENT DOCUMENTS

2016/0329478 A1* 11/2016 Jin .................. H10N 10/13
2021/0057495 A1   2/2021 Yuan et al.

FOREIGN PATENT DOCUMENTS

| JP | 2002151873 A | * | 5/2002 |
|---|---|---|---|
| KR | 10-2016-0131520 | | 11/2016 |
| KR | 10-2019-0048397 | | 5/2019 |
| KR | 10-2019-0126987 | | 11/2019 |

* cited by examiner

| Convective Heat Transfer Coefficient (W/m²K) | Convective Heat Transfer Coefficient | | | | | | |
|---|---|---|---|---|---|---|---|
| | 3 | 5 | 7 | 10 | 15 | 20 | 30 |
| Surface Temperature | 45.7293 | 43.6424 | 41.9171 | 39.8338 | 37.2820 | 35.4651 | 33.0625 |
| Convective Heat Transfer Coefficient (W/m²K) | Convective Heat Transfer Coefficient | | | | | | |
| | 50 | 70 | 90 | 120 | 150 | 180 | 210 |
| Surface Temperature | 30.5162 | 29.1907 | 28.3793 | 27.6196 | 27.1397 | 26.8089 | 26.5672 |
| Convective Heat Transfer Coefficient (W/m²K) | Convective Heat Transfer Coefficient | | |
| | 240 | 270 | 300 |
| Surface Temperature | 26.3827 | 26.2374 | 26.1198 |

DR3

ED: ANO, EL, CAT

HEAT DISSIPATION COMPOSITE, LOWER PANEL SHEET, AND DISPLAY DEVICE INCLUDING THE SAME

CROSS-REFERENCE TO RELATED APPLICATION

This application claims priority from and the benefit of Korean Patent Application No. 10-2020-0090821 filed on Jul. 22, 2020, which is hereby incorporated by reference for all purposes as if fully set forth herein.

BACKGROUND

Field

Exemplary implementations of the invention relate generally to a heat dissipation composite and, more specifically, to at least one of a lower panel sheet and a display device including the same.

Discussion of the Background

An electronic device such as a smart phone, a tablet PC, a digital camera, a laptop computer, a navigation system and a smart television, which provides an image to a user, includes a display device for displaying an image. The display device includes a display panel for generating and displaying an image and various input devices.

The display device may include a display panel generating an image with a plurality of light emitting elements and a heat dissipation member attached to a lower portion of the display panel. The plurality of light emitting elements of the display panel may display an image with power applied from the outside. A portion of the power applied for the plurality of light emitting elements to display an image (conversion from power to light energy) may not be converted to light energy but may be emitted outside of the display panel in the form of heat energy.

The heat energy emitted outside of the display panel is radiated through the outer surface of the heat dissipation member, and the degree of radiation may vary depending on the degree of heat transfer of the surface of the heat dissipation member and the heat capacity that varies with the thickness of the heat dissipation member.

The above information disclosed in this Background section is only for understanding of the background of the inventive concepts, and, therefore, it may contain information that does not constitute prior art.

SUMMARY

Applicant discovered ways to more effectively emit or radiate heat energy from a display panel without increasing the thickness of a heat dissipation layer on the display panel, such as by converting heat energy transferred from the heat dissipation layer to electric energy and electric energy to vibration.

Heat dissipation composites, lower panel sheets, and display devices including the same constructed according to the principles and exemplary implementations of the invention provide at least one of a heat dissipation composite, a lower panel sheet including a heat dissipation composite, and a display device including a heat dissipation composite with improved heat dissipation characteristics. For example, the heat dissipation composite may effectively emit or radiate heat energy from the display panel by inducing forced convection with the ambient air on the heat dissipation composite via a thermoelectric element layer on the heat dissipation layer and a piezoelectric element layer on the thermoelectric element layer without increasing the thickness of the heat dissipation layer itself to increase heat capacity of the heat dissipation layer.

Additional features of the inventive concepts will be set forth in the description which follows, and in part will be apparent from the description, or may be learned by practice of the inventive concepts.

According to one aspect of the invention, a heat dissipation composite for a display device includes: a heat absorber; an electricity generator disposed on the heat absorber to convert heat from the heat absorber into electricity; and a vibrator disposed on the electricity generator to convert the electricity provided from the electricity generator into vibration.

The heat dissipation composite may have a convective heat transfer coefficient equal to or greater than about 70 $W/m^2K$.

The heat absorber may include a heat dissipation layer, the electricity generator may include a thermoelectric element layer, the vibrator may include a piezoelectric element layer and the thermoelectric element layer may be disposed between the heat dissipation layer and the piezoelectric element layer.

A first heat dissipation bonding member may be disposed between the heat dissipation layer and the thermoelectric element layer to bond the heat dissipation layer and the thermoelectric element layer together; and a second heat dissipation bonding member may be disposed between the thermoelectric element layer and the piezoelectric element layer to bond the thermoelectric element layer and the piezoelectric element layer together.

The heat dissipation composite may have a thickness equal to or smaller than about 1 mm.

The thermoelectric element layer may further include a first thermoelectric element layer disposed between the first heat dissipation bonding member and the piezoelectric element layer, and a second thermoelectric element layer disposed between the first thermoelectric element layer and the piezoelectric element layer.

A third heat dissipation bonding member may be disposed between the first thermoelectric element layer and the second thermoelectric element layer to bond the first thermoelectric element layer and the second thermoelectric element layer together.

The electric generator may have a generally mesh shape including a plurality of open portions, and the heat absorber may be disposed in at least some of the plurality of open portions.

The heat absorber may be disposed on the same layer as the electric generator, and may be surrounded by the electric generator.

The vibrator may have a generally mesh shape including a plurality of open portions, and the electric generator may be disposed in at least some of the plurality of open portions.

The electric generator may be disposed on the same layer as the vibrator, and is surrounded by the vibrator.

The heat absorber may include a graphite sheet.

The electric generator may include bismuth telluride.

The vibrator may include a quartz, a potassium sodium tartrate, a titanium acid barium, an ammonium dihydrogen phosphate, or an ethylenediamine tartrate.

According to another aspect of the invention, a display device includes: a display panel including a plurality of light emitting elements; and a lower panel disposed on the display panel and including a heat dissipation composite, wherein the heat dissipation composite includes: a heat absorber; an electric generator disposed on the heat absorber to convert heat provided from the heat absorber into electricity; and a vibrator disposed on the electric generator to convert the electricity provided from the electric generator into vibration.

The heat dissipation composite may have a convective heat transfer coefficient equal to or greater than about 70 $W/m^2K$.

The heat dissipation composite may include a plurality of heat dissipation composites spaced apart from each other.

The display panel may include a central portion and a peripheral portion surrounding the central portion, and the plurality of heat dissipation composites may have an arrangement density that decreases in a direction from the peripheral portion to the central portion.

The heat absorber may include a heat dissipation layer, the electricity generator may include a thermoelectric element layer, the vibrator may include a piezoelectric element layer and the thermoelectric element layer may have a generally mesh shape including a plurality of open portions, the heat dissipation layer may be disposed in at least some of the plurality of open portions, and the heat dissipation layer may be disposed on the same layer as the thermoelectric element layer, and may be surrounded by the thermoelectric element layer.

The lower panel may include a lower panel sheet including a buffer member disposed between the heat absorber and the display panel, and a light blocking layer disposed between the buffer member and the display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 10 is a table showing surface temperature values given according to convective heat transfer coefficients of a heat dissipation composite constructed according to principles of the invention.

DETAILED DESCRIPTION OF THE EMBODIMENTS

Figure 1:
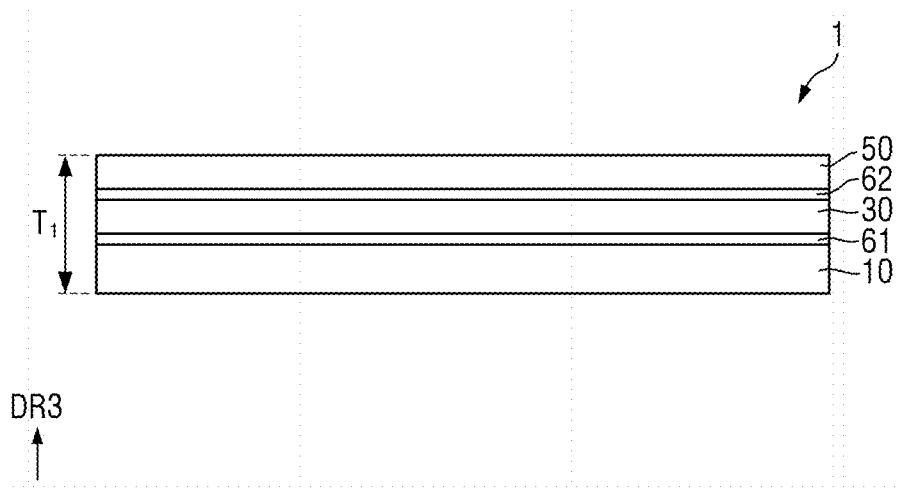
FIG. 1 is a cross-sectional view of an exemplary embodiment of a heat dissipation composite constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, sections, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, regions, integers, steps, operations, elements, components, and/or groups thereof, but do not preclude the presence or addition of one or more other features, regions, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. For example, "about" can mean within one or more standard deviations, or within ±30%, 20%, 10% or 5% of the stated value.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a cross-sectional view of an exemplary embodiment of a heat dissipation composite constructed according to principles of the invention. FIGS. 2 to 8 are schematic diagrams illustrating an exemplary embodiment of a heat dissipation process of a heat dissipation composite according to principles of the invention.

Figure 2:
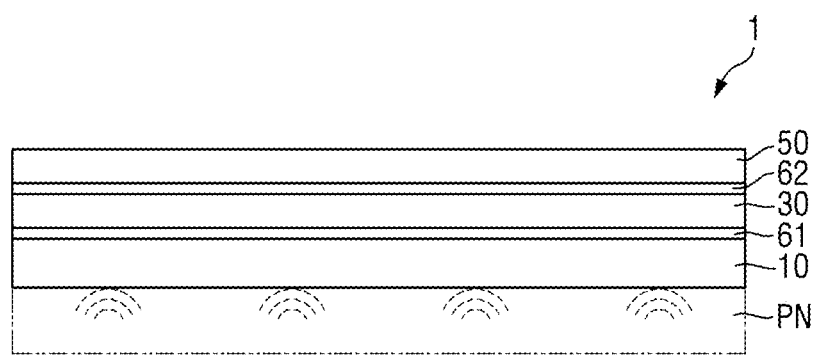
FIGS. 2 to 8 are schematic diagrams illustrating an exemplary embodiment of a heat dissipation process of a heat dissipation composite according to principles of the invention.

For simplicity of description, components other than the heat dissipation composite 1 of the lower panel sheet, disposed between the heat dissipation composite 1 and the display panel, are not depicted in FIG. 2.

Figure 3:
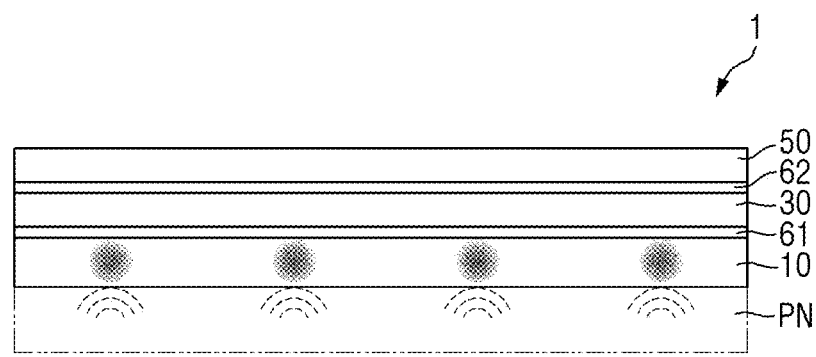
Figure 4:
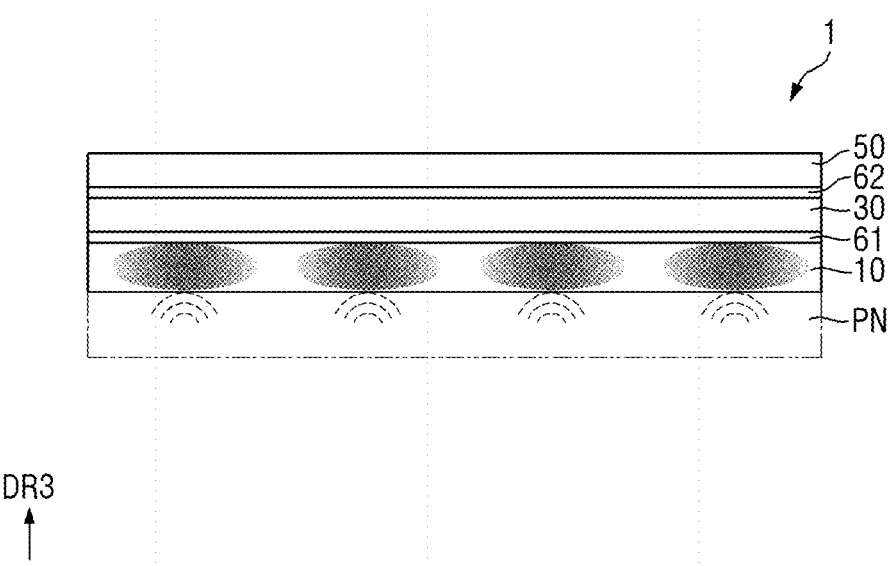
Figure 5:
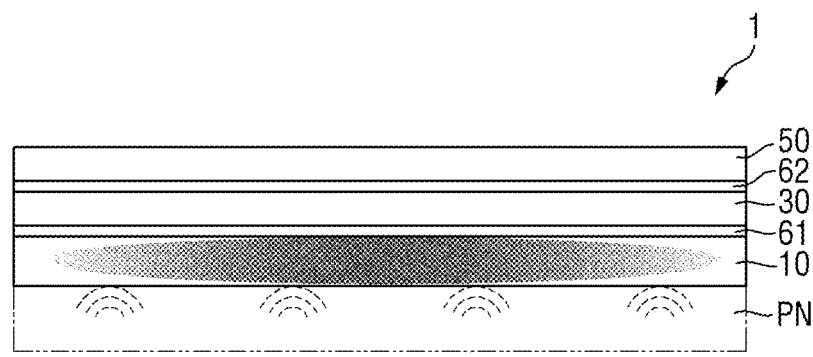
Figure 6:
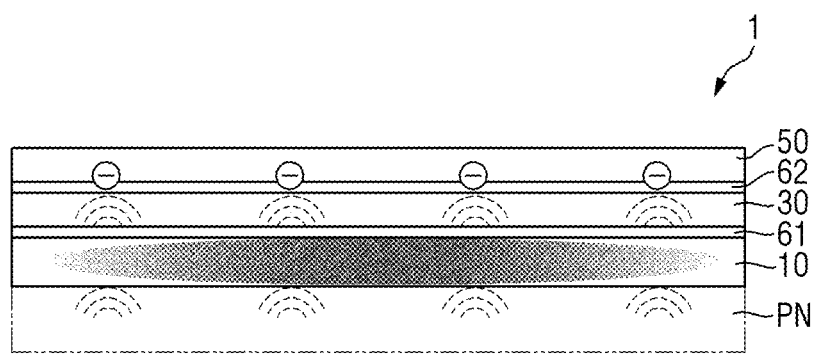
Figure 7:
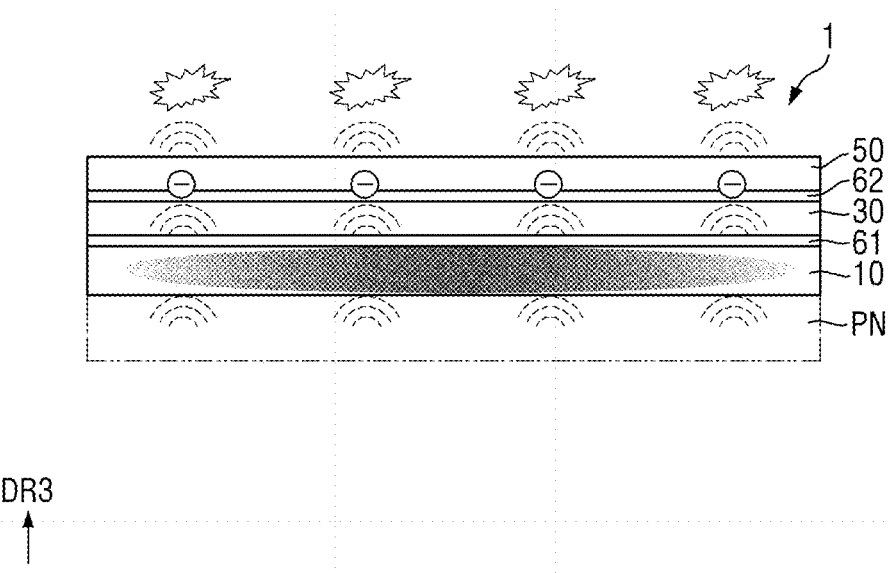
Figure 8:
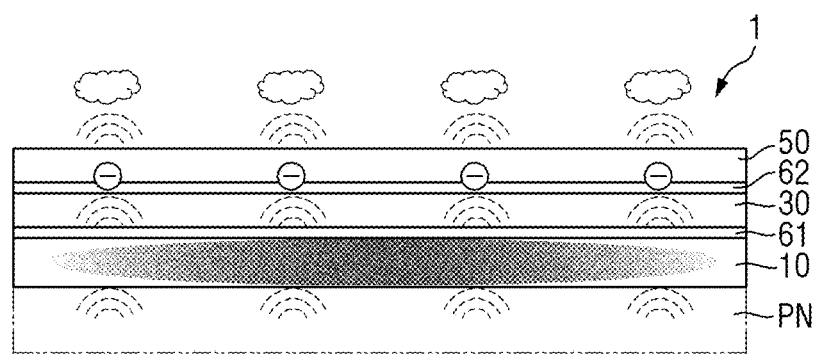

Referring to FIGS. 1 to 8, the heat dissipation composite 1 may be a component of the display panel that is formed as a composite from more than one material or layer and serves to discharge heat energy remaining that has not been converted to light energy by a plurality of light emitting elements of the display panel, as a portion of the power applied to the display panel. FIG. 2 is a schematic diagram illustrating that heat energy is emitted from a display panel PN. FIGS. 3 to 5 are schematic diagrams illustrating that the heat energy is transferred to a heat dissipation layer 10. FIG. 6 is a schematic diagram illustrating that heat energy is transferred from the heat dissipation layer 10 to a thermoelectric element layer 30 and the heat energy is converted to electric energy. FIG. 7 is a schematic diagram illustrating that vibration energy is generated via a piezoelectric element layer 50 by the electric energy converted in the thermoelectric element layer 30. FIG. 8 is a schematic diagram illustrating that forced convection is formed on a surface (outermost surface of the piezoelectric element layer 50) of a heat dissipation composite 1 by the vibration energy. For simplicity of description, components other than the heat dissipation composite 1 of the lower panel sheet, disposed between the heat dissipation composite 1 and the display panel, are not depicted in FIG. 2.

The heat dissipation composite 1 may include a heat absorber in the form of a heat dissipation layer 10, an electricity generator in the form of a thermoelectric element layer 30 disposed on the heat dissipation layer 10, and a vibrator in the form of a piezoelectric element layer 50 disposed on the thermoelectric element layer 30. The thermoelectric element layer 30 may be disposed between the heat dissipation layer 10 and the piezoelectric element layer 50.

The heat dissipation composite 1 may further include a first heat dissipation bonding member 61 disposed between the heat dissipation layer 10 and the thermoelectric element layer 30 to bond the heat dissipation layer 10 and the thermoelectric element layer 30 together, and a second heat dissipation bonding member 62 disposed between the thermoelectric element layer 30 and the piezoelectric element layer 50 to bond the thermoelectric element layer 30 and the piezoelectric element layer 50 together. The heat dissipation bonding members 61 and 62 may include the same material as the above-described bonding member, without being limited thereto.

In some exemplary embodiments, the heat dissipation bonding members 61 and 62 may be omitted such that the thermoelectric element layer 30 is formed in a manner of being coated on the heat dissipation layer 10, and the piezoelectric element layer 50 is formed in a manner of being coated on the thermoelectric element layer 30. The heat dissipation composite 1 may have a first thickness T1. For example, the first thickness T1 may be about 1 mm.

Referring to FIGS. 1 to 5, the heat dissipation layer 10 may serve to absorb the heat energy from the display panel. The degree of absorption of the heat energy of the heat dissipation layer 10 may be related to the material of the heat dissipation layer 10 and the heat capacity of the heat dissipation layer 10.

The material of the heat dissipation layer 10 may include a graphite, one or more carbon nanotubes, or a thin metal film. The heat dissipation layer 10 may be formed as a single layer. In some exemplary embodiments, the heat dissipation layer 10 may be formed as two or more layers. For example, the heat dissipation layer 10 may include a first heat dissipation layer, a second heat dissipation layer on the first heat dissipation layer, and a bonding member for bonding the first and second heat dissipation layers together.

In the case where the heat dissipation layer 10 includes the first and second heat dissipation layers, the first heat dissipation layer may be made of a thin metal film such as copper and silver among exemplary materials, and the second heat dissipation layer may be made of a graphite or one or more carbon nanotubes. The bonding member for bonding the first and second heat dissipation layers may include a well-known adhesive or bonding agent for bonding adjacent members. The following description is directed to the case where the heat dissipation layer 10 is formed as a single layer.

As shown in FIG. 2, heat energy may be provided from the display panel PN. As described above, the heat energy may be a portion of the power that is applied to the display panel PN, but not converted to light energy by the plurality of light emitting elements (ED in, e.g., FIG. 22) of the display panel PN.

As shown in FIG. 3, the heat energy provided from the display panel PN may be transferred to the heat dissipation layer 10. The heat energy provided from the display panel PN to the heat dissipation layer 10 may be first transferred to the heat dissipation layer 10 adjacent to heat sources (regions where heat is supplied as shown in FIG. 3) of the display panel PN.

As shown in FIG. 4, the heat energy transferred to the heat dissipation layer 10 may disperse left and right (in a substantially horizontal direction) from the heat dissipation layer 10 adjacent to the heat sources.

Subsequently, as shown in FIG. 5, heat dispersion regions formed by the heat dispersed left and right (in the substantially horizontal direction) from the heat dissipation layer 10 adjacent to the respective heat sources may be combined with adjacent heat dispersion regions.

As described above, the heat dissipation layer 10 may serve to absorb the heat energy from the display panel. In order to increase the degree of heat energy absorption of the heat dissipation layer 10, it may be possible to consider using materials having heat capacities greater than that of the exemplified material for the heat dissipation layer 10. However, the materials having heat capacities greater than that of the exemplified material may increase the manufacturing cost of the heat dissipation layer 10.

As described above, considering use other materials, instead of the exemplified material, for the heat dissipation layer 10 may be difficult. As another approach to increase the degree of heat energy absorption of the heat dissipation layer 10, consideration may be given to increase the heat capacity of the exemplified heat dissipation layer 10.

As used herein, the heat capacity of the heat dissipation layer 10 means, as energy is absorbed (or released) by a material or layer in response to an increase (or decrease) in temperature of the material or layer, the amount of heat required to increase the temperature of the material or layer by 1° C. Typically, the heat capacity is related to the thickness of the corresponding material or layer.

From this standpoint, as the thickness of the heat dissipation layer 10 increases, the heat capacity of the heat dissipation layer 10 increases, and the degree of absorption of heat energy from the display panel may increase. However, there may be a limit to increasing the thickness of the heat dissipation layer 10 for the purpose of increasing the degree of heat energy absorption of the heat dissipation layer 10. For example, increasing the thickness of the heat dissipation layer 10 may increase the material consumption costs or adversely affect the function or desirability of the display device accordingly.

In addition, even if the degree of heat energy absorption is increased by increasing the thickness of the heat dissipation layer 10, the emission or radiation of heat energy through the heat dissipation composite may be substantially related to heat exchange between the outermost surface (or layer) of the heat dissipation composite and the external temperature (or ambient temperature). That is, the degree of heat energy emission or radiation may be determined according to the degree of heat exchange caused by convection or radiation in association with the ambient air at the outermost surface (or layer) of the heat dissipation composite. From this standpoint, even if the degree of heat energy absorption is increased by increasing the thickness of the heat dissipation layer 10, it is necessary to ensure that convection or radiation effectively occurs on the surface of the heat dissipation composite to facilitate a heat energy dissipation function of the heat dissipation composite, means that there is a possibility that heat may be accumulated inside the heat dissipation layer 10.

Convection on the surface of the heat dissipation composite may include natural convection occurring naturally with the ambient air on the surface and forced convection exerted artificially with the ambient air on the surface.

Applicant discovered that it may be possible for the heat dissipation composite 1 to effectively emit or radiate heat energy from the display panel by inducing forced convection with the ambient air on the heat dissipation composite 1 via the thermoelectric element layer 30 on the heat dissipation layer 10 and the piezoelectric element layer 50 on the thermoelectric element layer 30 without increasing the thickness of the heat dissipation layer 10 itself for ensuring the heat capacity of the heat dissipation layer 10.

Referring to FIGS. 1 and 6, the thermoelectric element layer 30 may serve to convert heat energy transferred from the heat dissipation layer 10 to electric energy. The thermoelectric element layer 30 may be formed as a single layer.

The thermoelectric element layer 30 formed as a single layer may typically include a material capable of converting heat energy to electric energy. For example, the thermoelectric element layer 30 may include bismuth telluride ($Bi_2Te_3$), but is not limited thereto. For example, the thermoelectric element layer 30 may convert the heat energy transferred from the heat dissipation layer 10 to electric energy of negative charges. However, the exemplary embodiments are not limited thereto, and the thermoelectric element layer 30 may convert the heat energy transferred from the heat dissipation layer 10 to electric energy of positive charges.

In some exemplary embodiments, the thermoelectric element layer 30 may not be formed as a single layer and may include a heat absorbing portion for absorbing heat energy from the heat dissipation layer 10, a heat discharging portion for discharging the absorbed heat energy, and N-type and P-type semiconductors disposed between the heat absorbing portion and the heat discharging portion. In the case where the thermoelectric element layer 30 is formed in the above-described structure, it may be possible to produce electric energy in the process of absorbing the heat energy transferred from the thermoelectric element layer 30 via the heat absorbing portion and discharging the absorbed heat energy via the heat discharging portion. The following description is directed to the case where the thermoelectric element layer 30 is formed as a single layer.

Next, referring to FIGS. 1, 7, and 8, the piezoelectric element layer 50 may serve to convert the electric energy transferred from the thermoelectric element layer 30 to vibration energy. The piezoelectric element layer 50 may convert electric energy to vibration energy by using the electric energy transferred from the thermoelectric element layer 30 as power or driving voltage.

In some exemplary embodiments, the piezoelectric element layer 50 may be formed as a single layer. The piezoelectric element layer 50 may include a well-known material that is capable of converting electric energy to vibration energy. For example, the piezoelectric element layer 50 may include a quartz, a potassium sodium tartrate, such as a Rochelle salt, a titanium acid barium, an ammonium dihydrogen phosphate, or an ethylenediamine tartrate.

In some exemplary embodiments, the piezoelectric element layer 50 may not be formed as a single layer and may be implemented with a piezo element, an actuator using a small motor, or an electromagnet. The following description is directed to the case where the piezoelectric element layer 50 is formed as a single layer. As shown in FIG. 7, the electric energy provided from the thermoelectric element layer 30 may be converted to vibration energy by the piezoelectric element layer 50.

As shown in FIG. 8, the vibration energy produced by the piezoelectric element 50 may induce forced convection with the ambient air on the surface (surface opposite to one surface facing the second heat dissipation bonding member 62 or outermost surface opposite to one surface facing the display panel PN of the heat dissipation composite 1) of the piezoelectric element layer 50.

As described above, as the thickness of the heat dissipation layer 10 increases, the heat capacity of the heat dissipation layer 10 increases, and the degree of absorption of heat energy from the display panel may increase. However, there may be a limit to increasing the thickness of the heat dissipation layer 10 for the purpose of increasing the degree of heat energy absorption of the heat dissipation layer 10. For example, increasing the thickness of the heat dissipation layer 10 may increase the material consumption cost accordingly.

In addition, even if the degree of heat energy absorption is increased by increasing the thickness of the heat dissipation layer 10, the emission or radiation of heat energy through the heat dissipation composite may be substantially related to heat exchange between the outermost surface (or layer) of the heat dissipation composite and the external temperature (or ambient temperature). That is, the degree of heat energy emission or radiation may be determined according to the degree of heat exchange caused by convection or radiation in association with the ambient air at the outermost surface (or layer) of the heat dissipation composite. From this standpoint, even if the degree of heat energy absorption is increased by increasing the thickness of the heat dissipation layer 10, it is necessary to ensure that convection or radiation effectively occurs on the surface of the heat dissipation composite to facilitate a heat energy dissipation function of the heat dissipation composite, which means that there is a possibility that heat may be accumulated inside the heat dissipation layer 10. Convection on the surface of the heat dissipation composite may include natural convection occurring naturally with the ambient air on the surface and forced convection exerted artificially with the ambient air on the surface.

It may be possible for the heat dissipation composite 1 to effectively emit or radiate heat energy from the display panel by inducing forced convection with the ambient air on the heat dissipation composite 1 via the thermoelectric element layer 30 on the heat dissipation layer 10 and the piezoelectric element layer 50 on the thermoelectric element layer 30 without increasing the thickness of the heat dissipation layer 10 itself for ensuring the heat capacity of the heat dissipation layer 10.

The degree of external emission or radiation of heat energy by the heat dissipation composite 1 is related to the convective heat transfer coefficient. Typically, as the convective heat transfer coefficient increases, the degree of external heat energy emission may increase, and as the convective heat transfer coefficient decreases, the degree of external emission of heat energy may decrease. As used herein, the convective heat transfer coefficient refers to a coefficient representing the amount of heat transfer from a solid to a fluid by a convection phenomenon (aforementioned natural convection or forced convection).

The convective heat transfer coefficient of the heat dissipation composite 1 may be equal to or greater than about 50 $W/m^2K$. Preferably, the convective heat transfer coefficient of the heat dissipation composite 1 may be equal to or greater than about 70 $W/m^2K$.

Figure 9:
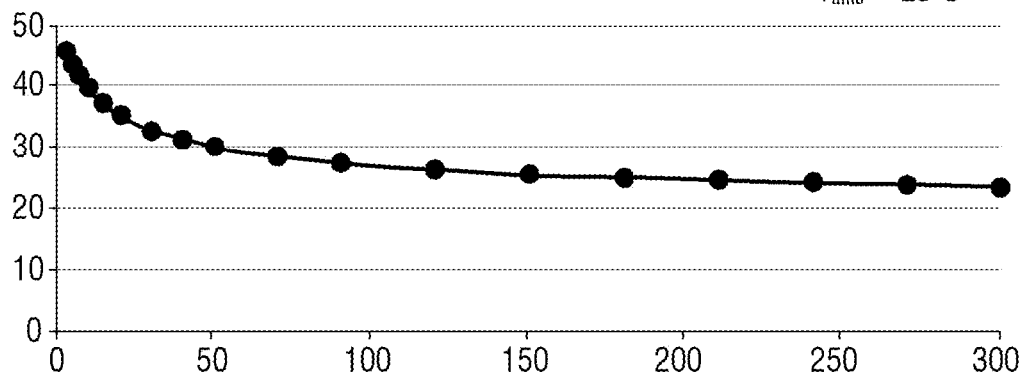
FIG. 9 is a graphical depiction illustrating surface temperature plotted against convective heat transfer coefficients of a heat dissipation composite constructed according to principles of the invention.

The convective heat transfer coefficient of the heat dissipation composite 1 according to some exemplary embodiments is described with reference to FIGS. 9 to 14. FIG. 9 is a graphical depiction illustrating surface temperature plotted against convective heat transfer coefficients of a heat dissipation composite constructed according to principles of the invention. FIG. 10 is a table showing surface temperature values given according to convective heat transfer coefficients of a heat dissipation composite constructed according to principles of the invention. FIGS. 11 to 14 are diagrams illustrating surface temperatures according to convective heat transfer coefficients of a heat dissipation composite constructed according to principles of the invention.

Figure 11:
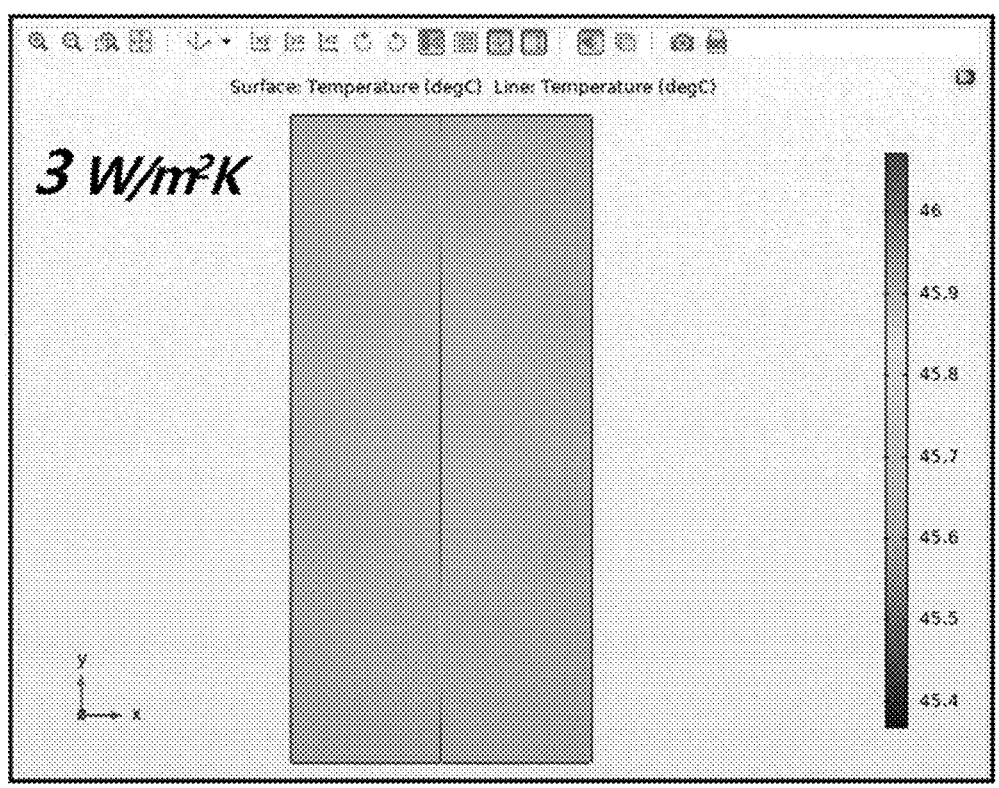
FIGS. 11 to 14 are diagrams illustrating surface temperatures according to convective heat transfer coefficients of a heat dissipation composite constructed according to principles of the invention.
Figure 12:
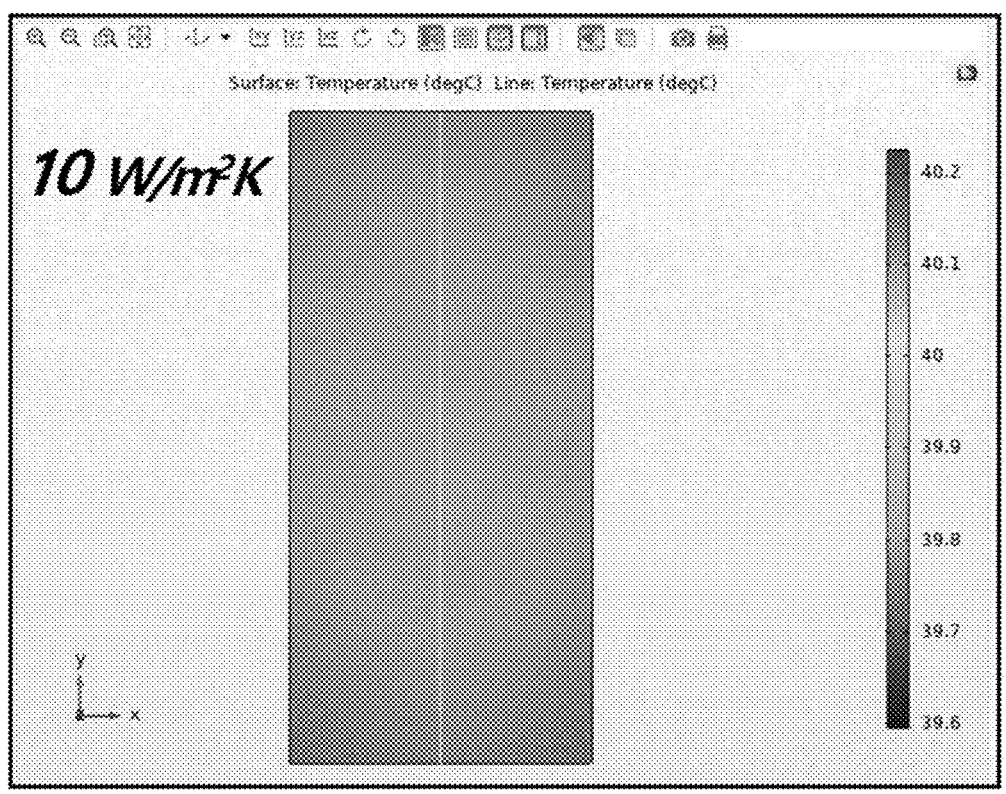
Figure 13:
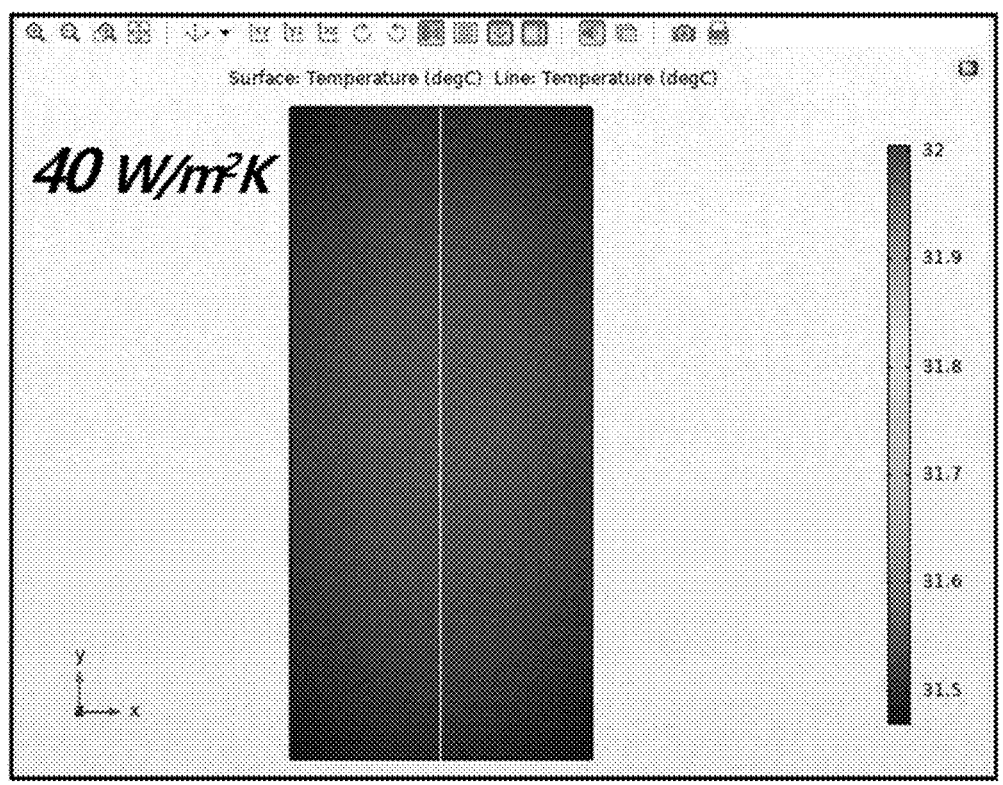
Figure 14:
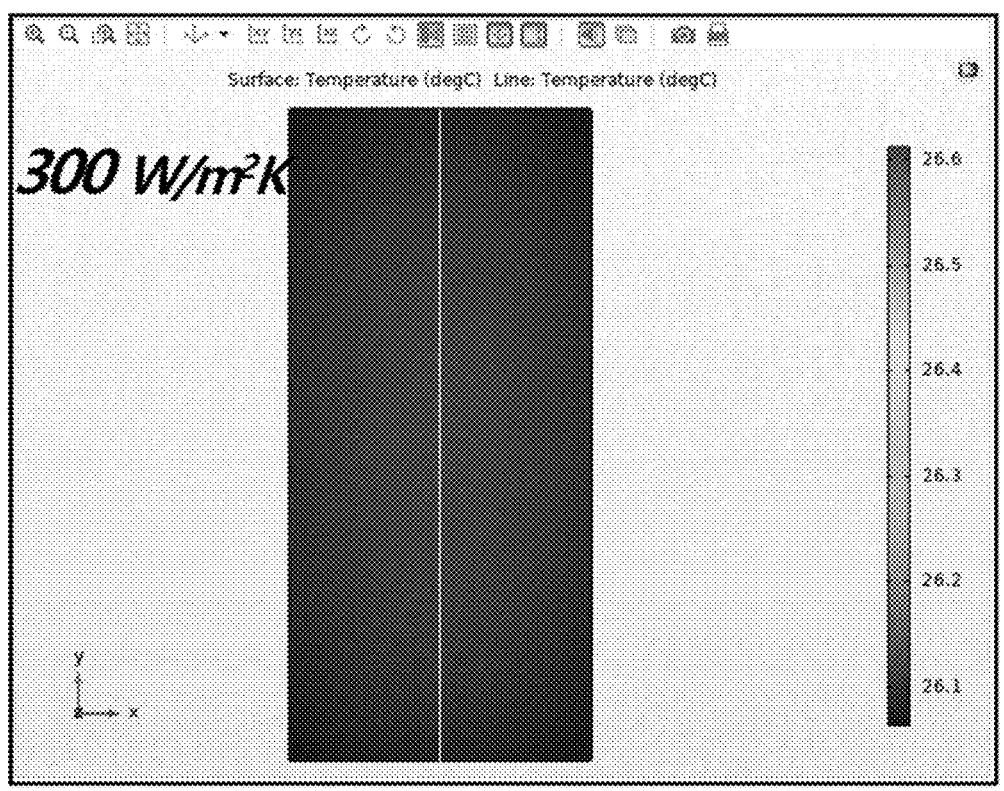

Referring to FIGS. 9 to 14, it is observed that the higher the convective heat transfer coefficient of the solid is, the lower the surface temperature of the solid tends to be. FIG. 9 is a graph in the case where the original surface temperature of the solid is about 45° C. and the surface temperature of the solid is measured at the corresponding convective heat transfer coefficient after about 1 hour. In FIG. 9, a horizontal axis represents the convective heat transfer coefficient (W/m$^2$K), and a vertical axis represents the surface temperature (° C.). FIG. 10 is a table showing the surface temperature of a solid according to a specific convective heat transfer coefficient. FIG. 11 is a diagram showing the surface temperature when the convective heat transfer coefficient of the solid is 3 W/m$^2$K. FIG. 12 is a diagram showing the surface temperature when the convective heat transfer coefficient of the solid is 10 W/m$^2$K. FIG. 13 is a diagram showing the surface temperature when the convective heat transfer coefficient of the solid is 40 W/m$^2$K. FIG. 14 is a diagram showing the surface temperature when the convective heat transfer coefficient of the solid is 300 W/m$^2$K.

As shown in FIGS. 9 to 14, it is observed that the convective heat transfer coefficient of the solid and the surface temperature of the solid show a schematic shape of a log function. In detail, it is observed that the surface temperature of the solid drops sharply as the convective heat transfer coefficient of the solid increases in the range from about 0 to about 50 and then the surface temperature of the solid decreases slightly as the convective heat transfer coefficient of the solid increases in the range greater than 50.

That is, the surface temperature of the solid that was measured after 1 hour may become close to the room temperature of 25° C. in comparison with the original surface temperature of the solid in the range where the convective heat transfer coefficient of the solid is greater than about 50.

As observed in FIGS. 9 to 14, the convective heat transfer coefficient (convective heat transfer coefficient caused by the forced convection) of the heat dissipation composite 1 is equal to or greater than about piezoelectric element layer 50 W/m$^2$K, preferably, equal to or greater than about 70 W/m$^2$K such that the original surface temperature of the heat dissipation composite 1 is about 45° C. and the surface temperature of the heat dissipation composite 1 may become close to the room temperature after about one hour.

As described above, it may be possible for the heat dissipation composite 1 to effectively emit or radiate heat energy from the display panel by inducing forced convection with the ambient air on the heat dissipation composite 1 via the thermoelectric element layer 30 on the heat dissipation layer 10 and the piezoelectric element layer 50 on the thermoelectric element layer 30 without increasing the thickness of the heat dissipation layer 10 itself for ensuring the heat capacity of the heat dissipation layer 10.

Hereinafter, a heat dissipation composite according to another exemplary embodiment will be described. In the following exemplary embodiment, the same components as those of the above-described exemplary embodiment are denoted by the same reference numerals, and a description thereof will be omitted or simplified to avoid redundancy.

Figure 15:
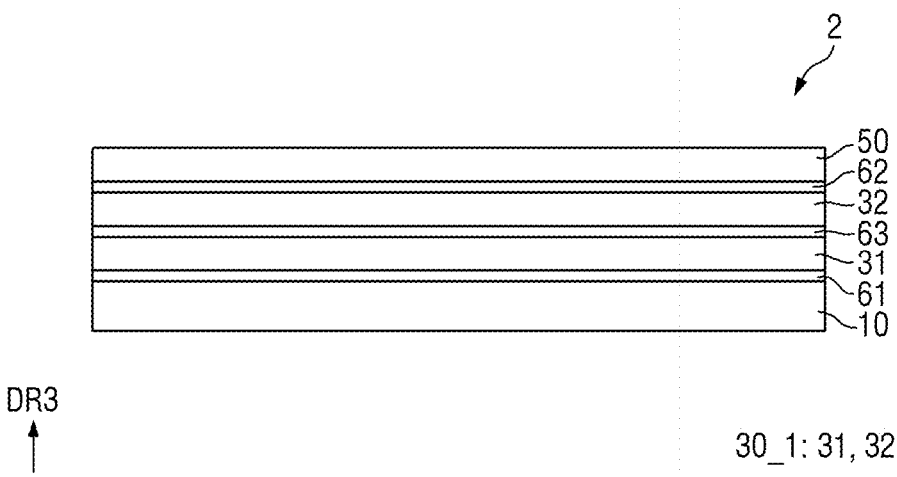
FIG. 15 is a cross-sectional view of another exemplary embodiment of a heat dissipation composite constructed according to principles of the invention.

FIG. 15 is a cross-sectional view of another exemplary embodiment of a heat dissipation composite constructed according to principles of the invention.

Referring to FIG. 15, a heat dissipation composite 2 differs from the heat dissipation composite 1 in that a thermoelectric element layer 30_1 includes a first thermoelectric element layer 31 and a second thermoelectric element layer 32.

In more detail, the heat dissipation composite 2 may include the thermoelectric element layer 30_1 including the first thermoelectric element layer 31 and the second thermoelectric element layer 32.

The first thermoelectric element layer 31 may be disposed between the first heat dissipation bonding member 61 and the piezoelectric element layer 50, and the second thermoelectric element layer 32 may be disposed between the first thermoelectric element layer 31 and the piezoelectric element layer 50.

In addition, the heat dissipation composite 2 may further include a third heat dissipation bonding member 63. The third heat dissipation bonding member 63 may include the same material as the above-described heat dissipation bonding members 61 and 62.

The first thermoelectric element layer 31 may be disposed between the third heat dissipation bonding member 63 and the first heat dissipation bonding member 61, and the second thermoelectric element layer 32 may be disposed between the third heat dissipation bonding member 63 and the second heat dissipation bonding member 62. That is, the first thermoelectric element layer 31 may be bonded to the heat dissipation layer 10 by the first heat dissipation bonding member 61, and the second thermoelectric element layer 32 may be bonded to the first thermoelectric element layer 31 by the third heat dissipation bonding member 63.

According to this exemplary embodiment, because the heat dissipation composite 2 includes two distinct thermoelectric element layers 31 and 32, the conversion from heat energy to electric energy by the thermoelectric element layers 31 and 32 can be more easily achieved. In more detail, the first thermoelectric element layer 31 may convert the heat energy transferred from the heat dissipation layer 10 to electric energy. The heat energy remaining without being converted after the first thermoelectric element layer 31 converts the heat energy transferred from the heat dissipation layer 10 may be converted to electric energy by the second thermoelectric element layer 32.

Although it is described in this exemplary embodiment that the thermoelectric element layer 30_1 includes two thermoelectric element layers 31 and 32, the exemplary embodiments are not limited thereto, and the thermoelectric element layer 30_1 may include three or more thermoelectric element layers.

Even in the case of the heat dissipation composite 2, it may be possible to effectively emit or radiate heat energy from the display panel by inducing forced convection with the ambient air on the heat dissipation composite 2 via the thermoelectric element layer 30_1 on the heat dissipation layer 10 and the piezoelectric element layer 50 on the thermoelectric element layer 30_1 without increasing the thickness of the heat dissipation layer 10 itself for ensuring the heat capacity of the heat dissipation layer 10.

Figure 16:
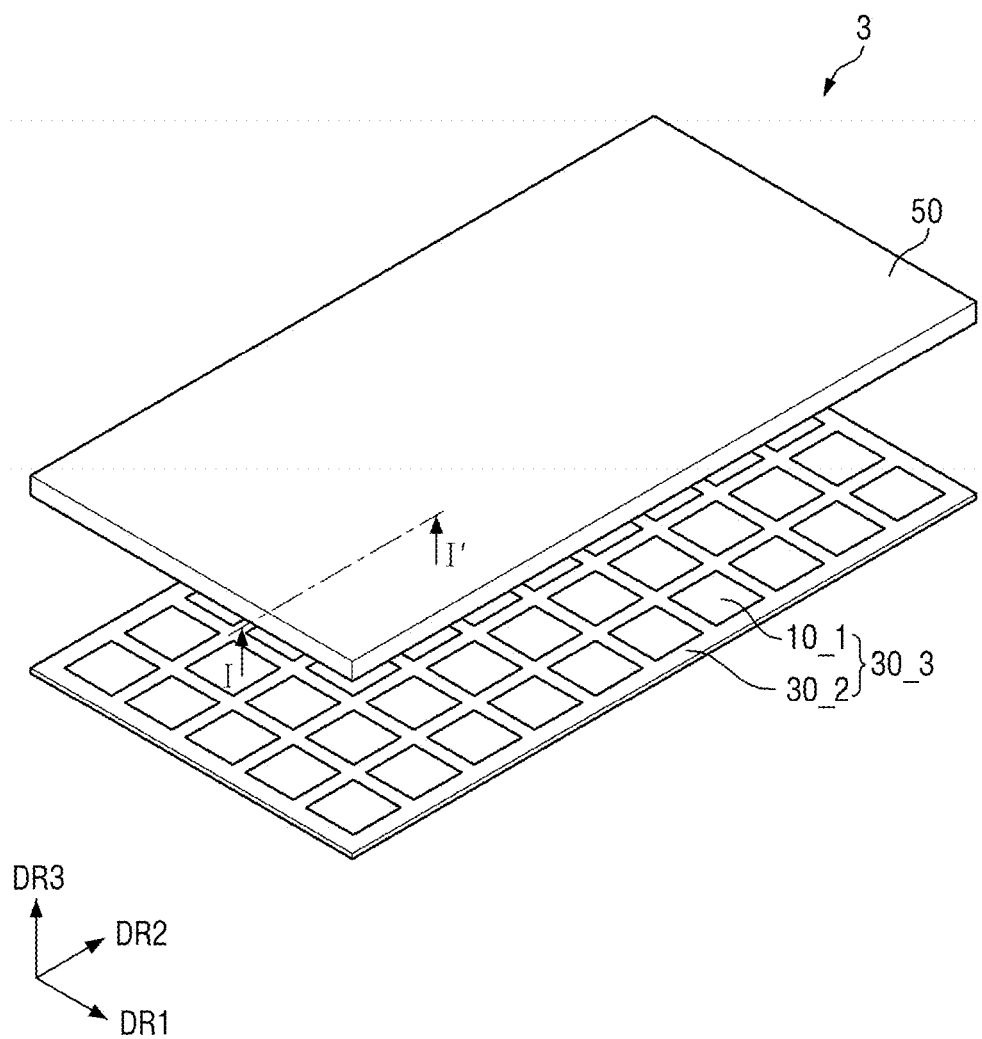
FIG. 16 is a perspective view of still another exemplary embodiment of a heat dissipation composite constructed according to principles of the invention.
Figure 17:
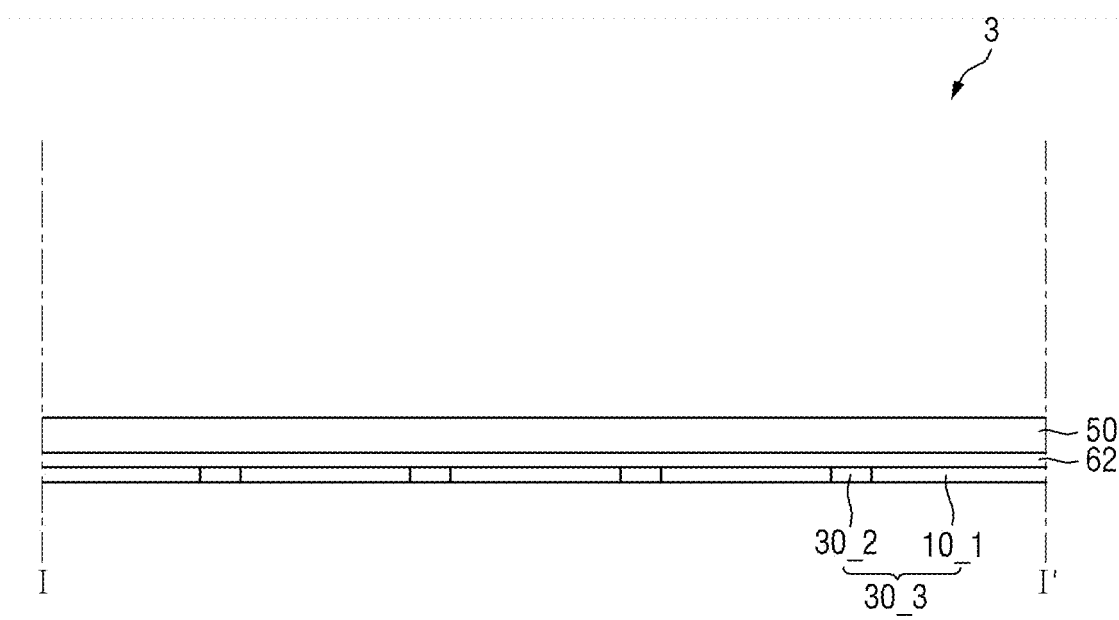
FIG. 17 is a cross-sectional view taken along line I-I' of FIG. 16.

FIG. 16 is a perspective view of still another exemplary embodiment of a heat dissipation composite constructed according to principles of the invention. FIG. 17 is a cross-sectional view taken along line I-I' of FIG. 16.

Referring to FIGS. 16 and 17, the heat dissipation composite 3 may include a thermoelectric element composite 30_3. In more detail, the heat dissipation composite 3 may include the thermoelectric element composite 30_3.

The heat dissipation composite 3 may have a generally rectangular shape including short sides extending along a first direction DR1 and long sides extending along a second direction DR2 intersecting the first direction DR1.

The thermoelectric element composite 30_3 may include a heat dissipation layer 10_1 and a thermoelectric element layer 30_2 on the heat dissipation layer 10_1. The thermoelectric element layer 30_2 may be arranged on the side surface of the heat dissipation layer 10_1.

According to this exemplary embodiment, the heat dissipation layer 10_1 and the thermoelectric element layer 30_2 constituting the thermoelectric element composite 30_3 may be disposed on the same layer.

In plan view, the thermoelectric element layer 30_2 may have a generally mesh shape including a plurality of open portions. There may be a plurality of heat dissipation layers 10_1. The plurality of heat dissipation layers 10_1 may be disposed in the plurality of open portions of the thermoelectric element layer 30_2, respectively. In plan view, the heat dissipation layer 10_1 may be completely surrounded by the thermoelectric element layer 30_2.

The thermoelectric element layer 30_2 disposed on the side surface of the heat dissipation layer 10_1 may serve to convert heat energy transferred from the heat dissipation layer 10_1 to electric energy.

As shown in FIG. 17, the thermoelectric element layer 30_2 may be disposed between adjacent heat dissipation layers 10_1, and the heat dissipation layer 10_1 may be disposed between adjacent thermoelectric element layers 30_2. The heat dissipation layer 10_1 may have a generally quadrangular shape in plan view. For example, the heat dissipation layer 10_1 may have a generally rectangular or generally square shape in plan view.

According to this exemplary embodiment, it is possible to reduce the overall thickness of the heat dissipation composite 3 by disposing the heat dissipation layer 10_1 and the thermoelectric element layer 30_2 in the same layer. Even in this exemplary embodiment, it may be possible to effectively emit or radiate heat energy transferred from the display panel by inducing forced convection with the ambient air on the heat dissipation composite 3 via the thermoelectric element layer 30_2 on the heat dissipation layer 10_1 and the piezoelectric element layer 50 on the thermoelectric element layer 30_2 without increasing the thickness of the heat dissipation layer 10_1 itself for ensuring the heat capacity of the heat dissipation layer 10_1.

Figure 18:
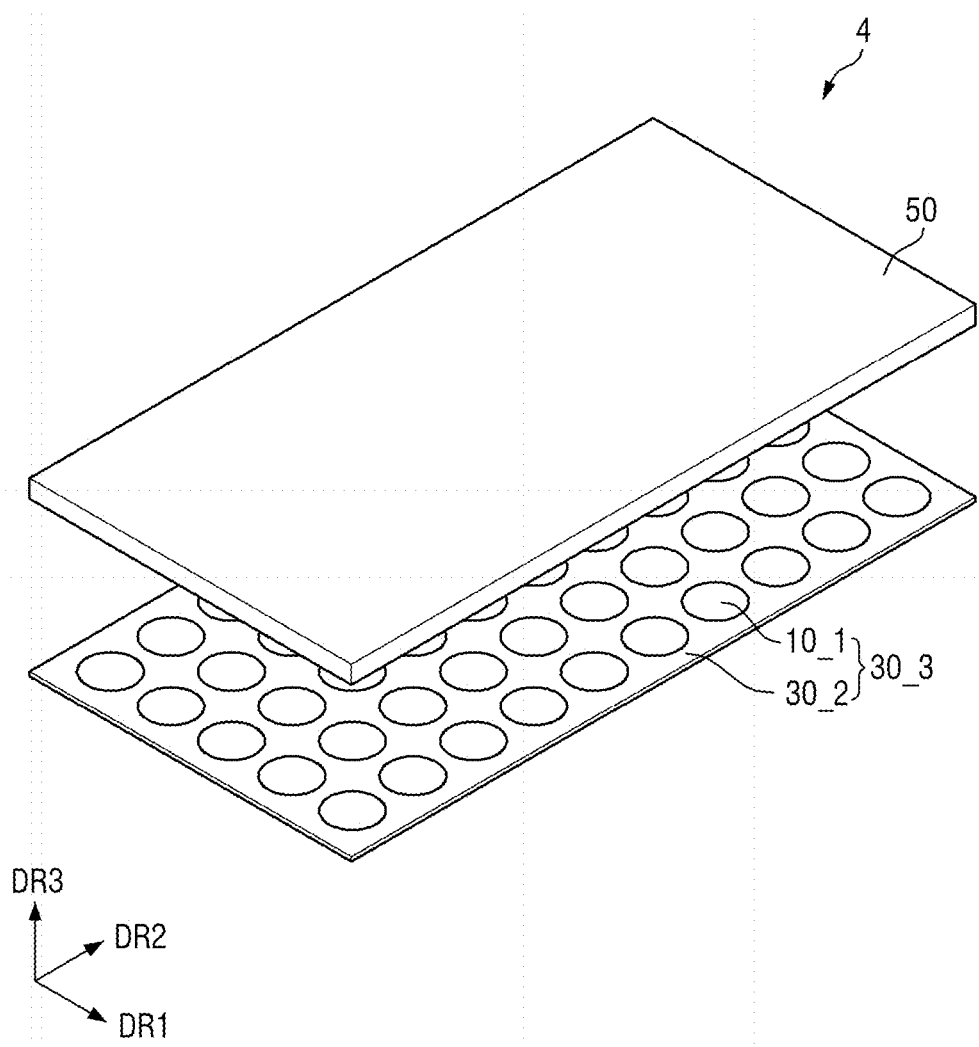
FIG. 18 is a perspective view of yet another exemplary embodiment of a heat dissipation composite constructed according to principles of the invention.

FIG. 18 is a perspective view of yet another exemplary embodiment of a heat dissipation composite constructed according to principles of the invention.

Referring to FIG. 18, a heat dissipation composite 4 differs from the heat dissipation composite 3 of FIG. 16 in that the heat dissipation layer 10_1 has a generally circular shape in plan view. In more detail, the heat dissipation composite 4 may include the heat dissipation layer 10_1 having a generally circular shape in plan view.

Even in this exemplary embodiment, it may be possible to effectively emit or radiate heat energy transferred from the display panel by inducing forced convection with the ambient air on the heat dissipation composite 3 via the thermoelectric element layer 30_2 on the heat dissipation layer 10_1 and the piezoelectric element layer 50 on the thermoelectric element layer 30_2 without increasing the thickness of the heat dissipation layer 10_1 itself for ensuring the heat capacity of the heat dissipation layer 10_1.

Figure 19:
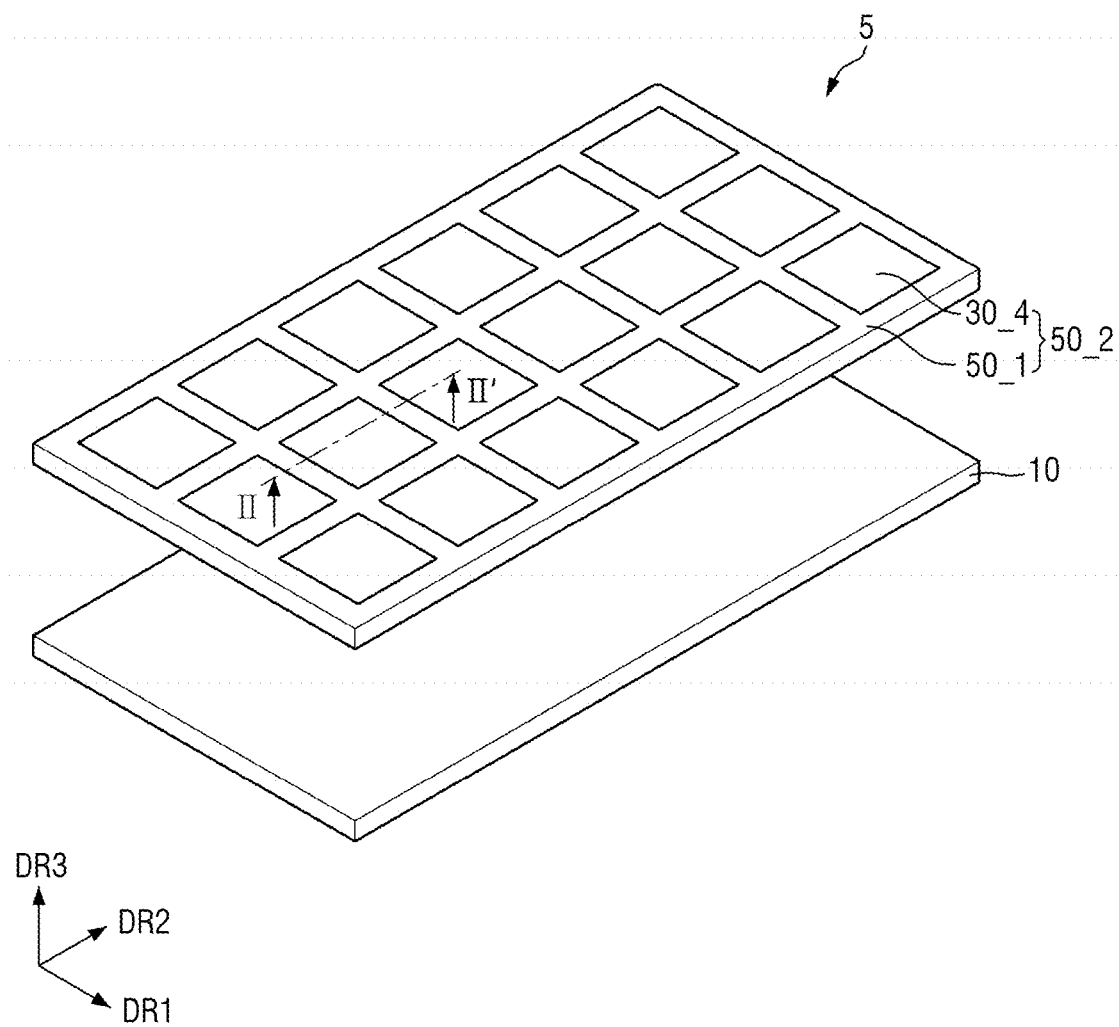
FIG. 19 is a perspective view of a further exemplary embodiment of a heat dissipation composite constructed according to principles of the invention.
Figure 20:
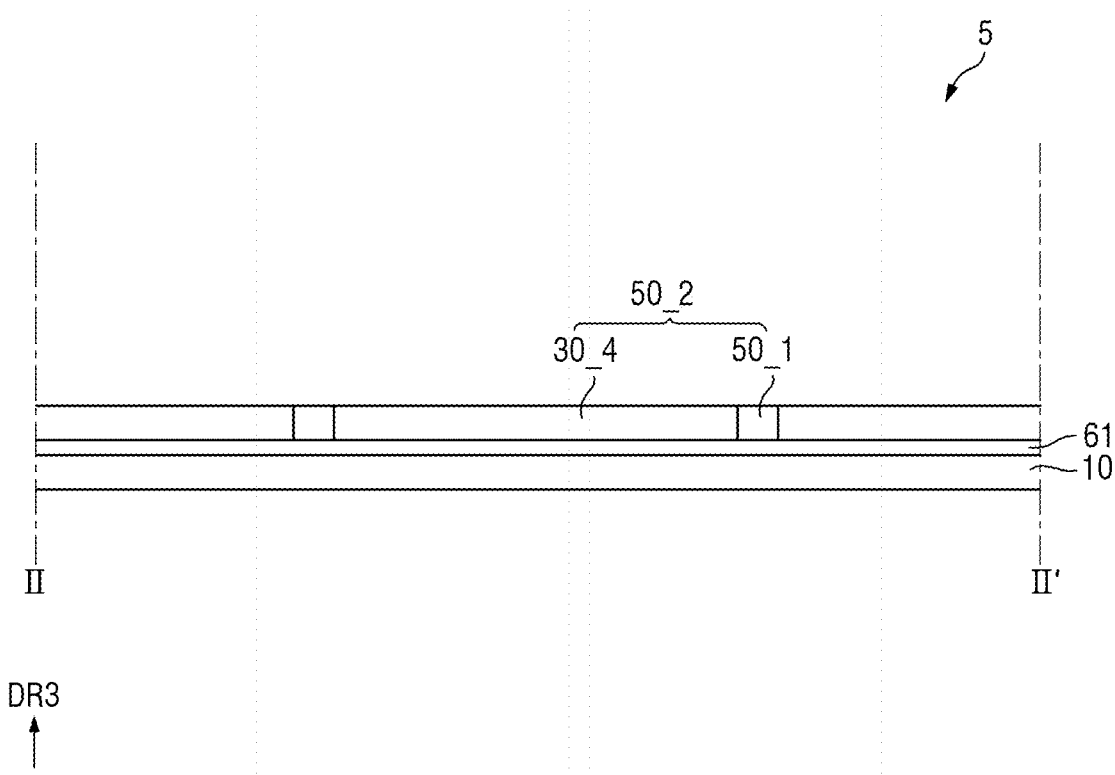
FIG. 20 is a cross-sectional view taken along line II-II' of FIG. 19.

FIG. 19 is a perspective view of a further exemplary embodiment of a heat dissipation composite constructed according to principles of the invention. FIG. 20 is a cross-sectional view taken along line of FIG. 19.

Referring to FIGS. 19 and 20, a heat dissipation composite 5 may include a piezoelectric element composite 50_2. In more detail, the heat dissipation composite 5 may include the piezoelectric element composite 50_2.

The heat dissipation composite 5 may have a generally rectangular shape including short sides extending along the first direction DR1 and long sides extending along the second direction DR2 intersecting the first direction DR1. The piezoelectric element composite 50_2 may include a thermoelectric element layer 30_4 and a piezoelectric element layer 50_1 on the thermoelectric element layer 30_4. The piezoelectric element layer 50_1 may be disposed on the side surface of the thermoelectric element layer 30_4. According to this exemplary embodiment, the thermoelectric element layer 30_4 and the piezoelectric element layer 50_1 constituting the piezoelectric element composite 50_2 may be disposed on the same layer.

In plan view, the piezoelectric element layer 50_1 may have a generally mesh shape including a plurality of open portions. There may be a plurality of thermoelectric element layers 30_4. The plurality of thermoelectric element layers 30_4 may be disposed in the plurality of open portions of the piezoelectric element layer 50_1, respectively. In plan view, the thermoelectric element layer 30_4 may be completely surrounded by the piezoelectric element layer 50_1.

The piezoelectric element layer 50_1 disposed on the side surface of the thermoelectric element layer 30_4 may serve to convert electric energy transferred from the thermoelectric element layer 30_4 to vibration energy. As shown in FIG. 20, the thermoelectric element layer 30_4 may be disposed between adjacent piezoelectric element layers 50_1, and the piezoelectric element layer 50_1 may be disposed between adjacent thermoelectric element layers 30_4.

The thermoelectric element layer 30_4 may have a generally quadrangular shape in plan view. For example, the thermoelectric element layer 30_4 may have a generally rectangular or generally square shape in plan view. According to this exemplary embodiment, it is possible to reduce the overall thickness of the heat dissipation composite 5 by the thermoelectric element layer 30_4 and the piezoelectric element layer 50_1 in the same layer.

Even in this exemplary embodiment, it may be possible to effectively emit or radiate heat energy transferred from the display panel by inducing forced convection with the ambient air on the heat dissipation composite 5 via the thermoelectric element layer 30_4 on the heat dissipation layer 10 and the piezoelectric element layer 50_1 on the thermoelectric element layer 30_4 without increasing the thickness of the heat dissipation layer 10 itself for ensuring the heat capacity of the heat dissipation layer 10.

Hereinafter, a lower panel sheet of a display device including a heat dissipation composite according to some exemplary embodiments will be described. In the following exemplary embodiment, the same components as those of the above-described exemplary embodiment are denoted by the same reference numerals, and a description thereof will be omitted or simplified to avoid redundancy.

Figure 21:
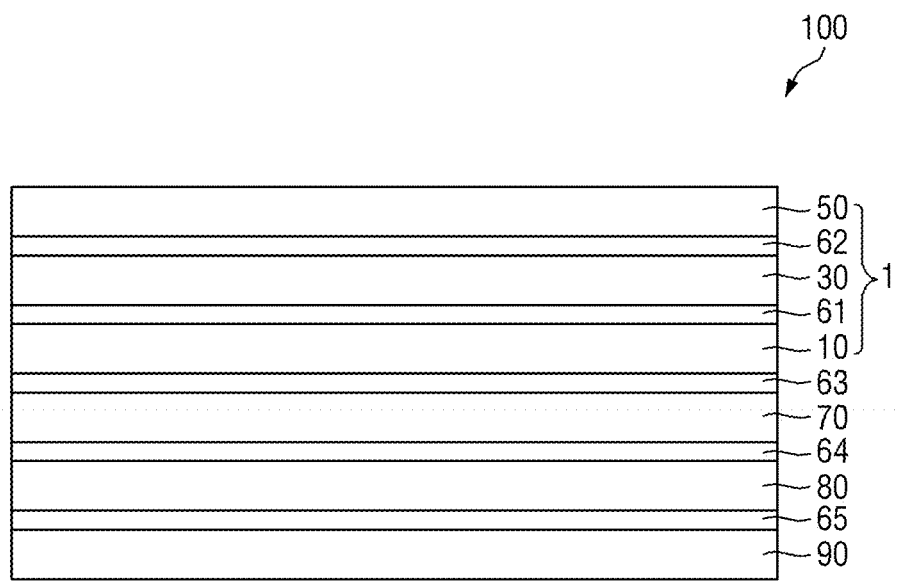
FIG. 21 is a cross-sectional view of an exemplary embodiment of a lower panel sheet of a display device constructed according to principles of the invention.

FIG. 21 is a cross-sectional view of an exemplary embodiment of a lower panel sheet of a display device constructed according to principles of the invention.

Referring to FIG. 21, a lower panel sheet 100 includes at least one functional layer. The functional layer may be a layer that performs a heat dissipation function, an electromagnetic shielding function, a grounding function, a buffering function, a rigidity enhancing function, a supporting function, a light shielding function, and/or a digitizing function. The functional layer may be a sheet layer, a film layer, a thin layer, a coating layer, a panel, a plate, or the like. One functional layer may consist of a single layer or a stack of multiple thin films or coating layers. The functional layer may be, for example, a supporting member, a heat dissipation layer, an electromagnetic shielding layer, an impact absorbing layer, a digitizer, or the like.

FIG. 21 exemplarily shows the lower panel sheet 100 including a heat dissipation composite 1 having a heat dissipation function, a buffer member 70 having a buffering function and a strength reinforcing function on the heat dissipation composite 1, a light blocking layer 80 having a light blocking function on the buffer member 70, and a support film 90 having a supporting function on the light blocking layer 80. However, the stacked structure of the lower panel sheet 100 is not limited to that illustrated in FIG. 21, and other functional layers described above may be further disposed, or the layers other than the heat dissipation composite 1 may be omitted in the stacked structure illustrated in FIG. 21.

Bonding members may be disposed between the heat dissipation composite 1, the buffer member 70, the light blocking layer 80, and the support film 90 to bond the adjacent components together. For example, the bonding members may include a heat dissipation-buffer member bonding member 63 disposed between the heat dissipation layer 10 and the buffer member 70, a buffer-light blocking layer bonding member 64 disposed between the buffer member 70 and the light blocking layer 80, and a light blocking-support film bonding member 65 disposed between the light blocking layer 80 and the support film 90. Each of the bonding member 63, 64, and 65 may include an adhesive or a bonding agent.

The buffer member 70 may include, for example, a material having elasticity such as a polyurethane or a polyethylene resin. The buffer member 70 may be a cushion layer. The light blocking layer 80 may include a black dye or a pigment that absorbs visible light. For example, the light blocking layer 80 may include the same material as a black matrix. The support film 90 may serve to support the display panel, and may include a polyimide (PI) or a polyethylene terephthalate (PET), without being limited thereto.

Hereinafter, a display device including a lower panel sheet according to some exemplary embodiments will be described. In the following exemplary embodiment, the same components as those of the above-described exemplary embodiment are denoted by the same reference numerals, and a description thereof will be omitted or simplified to avoid redundancy.

Figure 22:
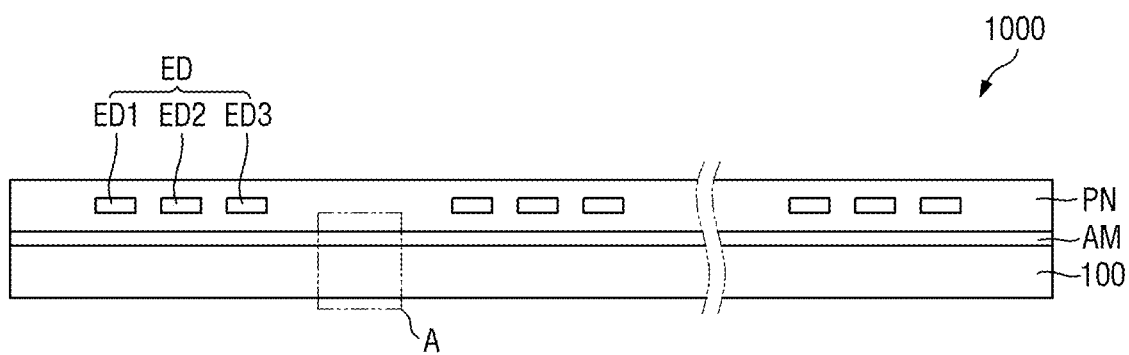
FIG. 22 is a cross-sectional view of an exemplary embodiment of a display device constructed according to principles of the invention having the lower panel sheet of FIG. 21.
Figure 23:
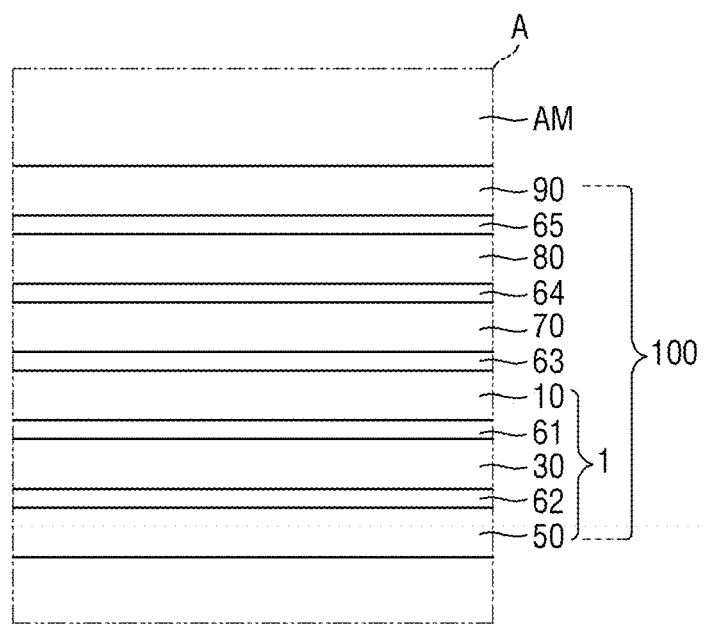
FIG. 23 is an enlarged cross-sectional view of area A of FIG. 22.
Figure 24:
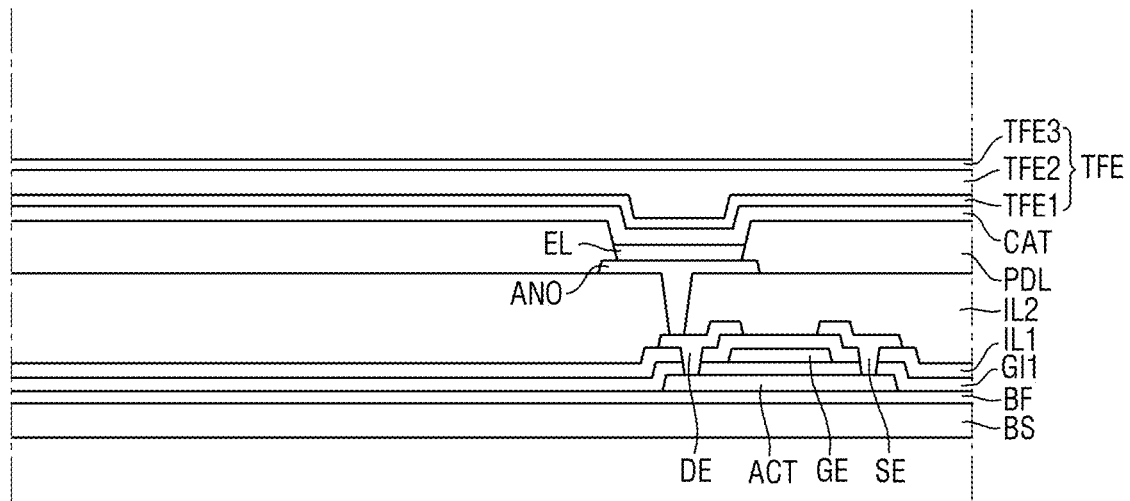
FIG. 24 is a cross-sectional view of the display panel of FIG. 22.
Figure 24:

FIG. 22 is a cross-sectional view of an exemplary embodiment of a display device constructed according to principles of the invention having the lower panel sheet of FIG. 21. FIG. 23 is an enlarged cross-sectional view of area A of FIG. 22. FIG. 24 is a cross-sectional view of the display panel of FIG. 22.

Referring to FIG. 22, a display device 1000 may include a display panel PN, a heat dissipation composite 1 disposed on the display panel PN, and a bonding member AM disposed between the display panel PN and the heat dissipation composite 1. The bonding member AM may include the same material as the heat dissipation bonding members 61 and 62 described with reference to FIG. 1, but is not limited thereto.

The display panel PN may be a light emitting display panel including light emitting elements ED. For example, the display panel PN may be an organic light emitting display panel using an organic light emitting diode, a micro light emitting diode display panel using a micro LED, or a quantum dot light emitting display panel including a quantum dot light emitting diode (QLED). The following description is directed to the case where the display panel PN is an organic light emitting display panel.

The light emitting elements ED may include a first light emitting element ED1 to a third light emitting element ED3. The first light emitting element ED1 may be a red light emitting element radiating red light, the second light emitting element ED2 may be a green light emitting element radiating green light, and the third light emitting element ED3 may be a blue light emitting element radiating blue light. The peak wavelength range of red light may be about 620 nm to about 750 nm, and the peak wavelength range of green light may be about 495 nm to about 570 nm. Further, the peak wavelength range of blue light may be about 450 nm to about 495 nm. In some exemplary embodiments, the light emitting elements ED may further include a white light emitting element radiating white light.

Referring to FIGS. 22 and 23, the display panel PN may be bonded with the support film 90 via the bonding member AM. The detailed descriptions of the lower panel sheet 100 and the heat dissipation composite 1 have been made with reference to FIGS. 1 and 21 and are omitted hereinbelow to avoid redundancy.

Referring to FIG. 24, the display panel PN may include a base substrate BS, a buffer layer BF on the base substrate BS, a semiconductor layer ACT on the buffer layer BF, a first gate insulating layer GI1 on the semiconductor layer ACT, a gate electrode GE on the first gate insulating layer GI1, a first interlayer insulating layer IL1 on the gate electrode GE, a source/drain electrode SE/DE on the first interlayer insulating layer IL1, a second interlayer insulating layer IL2 on the source/drain electrode SE/DE, an anode electrode ANO on the second interlayer insulating layer IL2, a pixel definition layer PDL on the anode electrode ANO, an organic layer EL, a cathode electrode CAT on the organic layer EL and the pixel definition layer PDL, and a thin film encapsulation layer TFE on the cathode electrode CAT.

The base substrate BS may include a polymer material having flexibility. For example, the base substrate BS may include a polyethersulphone (PES), a polyacrylate (PA), a polyarylate (PAR), a polyetherimide (PEI), a polyethylenenapthalate (PEN), a polyethylene terephthalate (PET), a polyphenylene sulfide (PPS), a polyallylate, a polyimide (PI), a polycarbonate (PC), a cellulose triacetate (CAT), a cellulose acetate propionate (CAP), or a combination thereof. In some exemplary embodiments, the base substrate BS may include a rigid material. For example, the base substrate BS may include a glass, a quartz, or the like.

The buffer layer BF may be disposed on the base substrate BS. The buffer layer BF may be formed on the base substrate BS to protect the light emitting elements ED and thin film transistors, which will be described below, from moisture permeating through the base substrate BS susceptible to moisture permeation. The buffer layer BF may be formed of a plurality of inorganic layers that are alternately stacked. For example, the buffer layer BF may be formed of a multilayer in which one or more inorganic layers of a silicon oxide ($SiO_x$) layer, a silicon nitride ($SiN_x$) layer and a silicon oxynitride (SiON) layer are alternately stacked. The buffer layer BF may be omitted.

The semiconductor layer ACT may be disposed on the buffer layer BF. The semiconductor layer ACT may be formed of a silicon-based semiconductor material or an oxide-based semiconductor material. A light blocking layer may be formed between the buffer layer BF and the semiconductor layer ACT to block external light incident on the semiconductor layer ACT.

The first gate insulating layer GI1 may be disposed on the semiconductor layer ACT. The first gate insulating layer GI1 may be formed of an inorganic layer such as a silicon oxide ($SiO_x$) layer and a silicon nitride ($SiN_x$) layer, or a multilayer thereof.

The gate electrode GE and a gate line may be formed on the first gate insulating layer GI1. The gate electrode GE and the gate line may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The first interlayer insulating layer IL1 may be disposed on the gate electrode GE. The first interlayer insulating layer IL1 may be formed of an inorganic layer such as a silicon oxide ($SiO_x$) layer and a silicon nitride ($SiN_x$) layer, or a multilayer thereof.

The source/drain electrode SE/DE and a data line may be disposed on the first interlayer insulating layer IL1. The source electrode SE and the drain electrode DE may each be connected to the semiconductor layer ACT through a contact hole penetrating the first gate insulating layer GI1 and the first interlayer insulating layer IL1. The source/drain electrode SE/DE and the data line may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The semiconductor layer ACT, the gate electrode GE, and the source/drain electrode SE/DE may form a thin film transistor. The second interlayer insulating layer IL2 for insulating the thin film transistor may be disposed on the source/drain electrode SE/DE and the data line. The second interlayer insulating layer IL2 may be formed of an inorganic layer such as a silicon oxide ($SiO_x$) layer and a silicon nitride ($SiN_x$) layer, or a multilayer thereof.

In some exemplary embodiments, the second interlayer insulating layer IL2 may be omitted. A planarization layer may be further disposed on the second interlayer insulating layer IL2. The planarization layer may be formed of an organic layer such as an acryl resin, an epoxy resin, a phenolic resin, a polyamide resin, a polyimide resin and the like.

The light emitting elements ED may be disposed on the planarization layer. The light emitting element ED may include an anode electrode ANO, an organic layer OL, a cathode electrode CAT. The light emitting elements ED and the pixel definition layer PDL may be disposed on the planarization layer. The light emitting element ED may be an organic light emitting diode.

The anode electrode ANO may be formed on the planarization layer. The anode electrode ANO may be connected to the drain electrode DE of the thin film transistor through a contact hole penetrating the planarization layer and the second interlayer insulating layer IL2.

The pixel defining layer PDL may be formed to cover the edges of the anode electrode ANO on the planarization layer to delimit the pixels. That is, the pixel defining layer PDL serves as a pixel defining layer for defining the pixels.

The organic layers EL are formed on the anode electrode ANO and the pixel defining layer PDL. The organic layer EL may be an organic light emitting layer. The organic layer EL may emit one of red light, green light and blue light. The peak wavelength range of red light may be about 620 nm to about 750 nm, and the peak wavelength range of green light may be about 495 nm to about 570 nm. Further, the peak wavelength range of blue light may be about 450 nm to about 495 nm. Alternatively, the organic layer EL may be a white light emitting layer that emits white light. In this case, the organic layer EL may have a structure in which a red light emitting layer, a green light emitting layer, and a blue light emitting layer are stacked, and may be a common layer formed commonly for the pixels. In this case, the display panel PN may further include a separate color filter for displaying a red, green or blue color.

The organic layer EL may include a hole transporting layer, a light emitting layer, and an electron transporting layer. In addition, the organic layer EL may be formed in a tandem structure of two or more stacks, in which case a charge generating layer may be formed between the stacks.

The cathode electrode CAT may be formed on the organic layer EL. The cathode electrode CAT may be formed to cover the organic layer EL. The cathode electrode CAT may be a common layer formed commonly for the pixels.

In the case where the light emitting element ED is formed by a top emission method in which light is emitted upward, the anode electrode ANO may be formed of a metal material having high reflectivity to have a stacked structure (Ti/Al/Ti) of aluminum and titanium, a stacked structure (ITO/Al/ITO) of aluminum and an indium tin oxide (ITO), an APC alloy, and a stacked structure (ITO/APC/ITO) of a silver-palladium-copper (APC) alloy and an ITO. The APC alloy is an alloy of silver (Ag), palladium (Pd) and copper (Cu). Further, the cathode electrode CAT may be formed of a transparent conductive material (TCO) such as an ITO or an indium zinc oxide (IZO) that can transmit light or a semi-transmissive conductive material such as magnesium (Mg), silver (Ag), or an alloy of magnesium (Mg) and silver (Ag). In the case where the cathode electrode CAT is formed of a semi-transmissive conductive material, the light emission efficiency may be increased due to a micro-cavity effect.

In the case where the light emitting element ED is formed by a bottom emission method in which light is emitted downward, the anode electrode ANO may be formed of a transparent conductive material (TCO) such as an ITO or an IZO or a semi-transmissive conductive material such as magnesium (Mg), silver (Ag), or an alloy of magnesium (Mg) and silver (Ag). The cathode electrode CAT may be formed of a metal material, having high reflectivity, such as a stacked structure (Ti/Al/Ti) of aluminum (Al) and titanium (Ti), a stacked structure (ITO/Al/ITO) of Al and an ITO, an APC alloy, a stacked structure (ITO/APC/ITO) of an APC alloy and an ITO, or the like. In the case where the anode electrode ANO is formed of a semi-transmissive conductive material, the light emission efficiency may be increased due to a micro-cavity effect.

The thin film encapsulation layer TFE may be formed on the light emitting elements ED. The thin film encapsulation layer TFE may serve to prevent permeation of oxygen or moisture into the organic layer EL and the cathode electrode CAT. To this end, the thin film encapsulation layer TFE may include at least one inorganic layer. The thin film encapsulation layer TFE may include a first inorganic layer TFE1 on the cathode electrode CAT, a thin film organic layer TFE2 on the first inorganic layer TFE1, and a second inorganic layer TFE3 on the thin film organic layer TFE2.

The inorganic layers TFE1 and TFE2 may be formed of a silicon nitride, an aluminum nitride, a zirconium nitride, a titanium nitride, a hafnium nitride, a tantalum nitride, a silicon oxide, an aluminum oxide, or a titanium oxide. The thin film organic layer TFE2 may include an epoxy, an acrylate or an urethane acrylate.

Even in this exemplary embodiment, it may be possible to increase the degree of absorption of heat energy transferred from the display panel because the heat capacity of the heat dissipation layer 10 increases as the thickness of the heat dissipation layer 10 increases, as described above.

However, there may be a limit to increasing the thickness of the heat dissipation layer 10 for the purpose of increasing the degree of heat energy absorption of the heat dissipation layer 10. For example, increasing the thickness of the heat dissipation layer 10 may increase the material consumption cost accordingly.

In addition, even if the degree of heat energy absorption is increased by increasing the thickness of the heat dissipation layer 10, the emission or radiation of heat energy through the heat dissipation composite may be substantially related to heat exchange between the outermost surface (or layer) of the heat dissipation composite and the external temperature (or ambient temperature). That is, the degree of heat energy emission or radiation may be determined according to the degree of heat exchange caused by convection or radiation in association with the ambient air at the outermost surface (or layer) of the heat dissipation composite. From this standpoint, even if the degree of heat energy absorption is increased by increasing the thickness of the heat dissipation layer 10, it is necessary to ensure that convection or radiation effectively occurs on the surface of the heat dissipation composite to facilitate a heat energy dissipation function of the heat dissipation composite, which means that there is a possibility that heat may be accumulated inside the heat dissipation layer 10.

Convection on the surface of the heat dissipation composite may include natural convection occurring naturally with the ambient air on the surface and forced convection exerted artificially with the ambient air on the surface. It may be possible for the heat dissipation composite 1 to effectively emit or radiate heat energy from the display panel by inducing forced convection with the ambient air on the heat dissipation composite 1 via the thermoelectric element layer 30 on the heat dissipation layer 10 and the piezoelectric element layer 50 on the thermoelectric element layer 30 without increasing the thickness of the heat dissipation layer 10 itself for ensuring the heat capacity of the heat dissipation layer 10.

Figure 25:
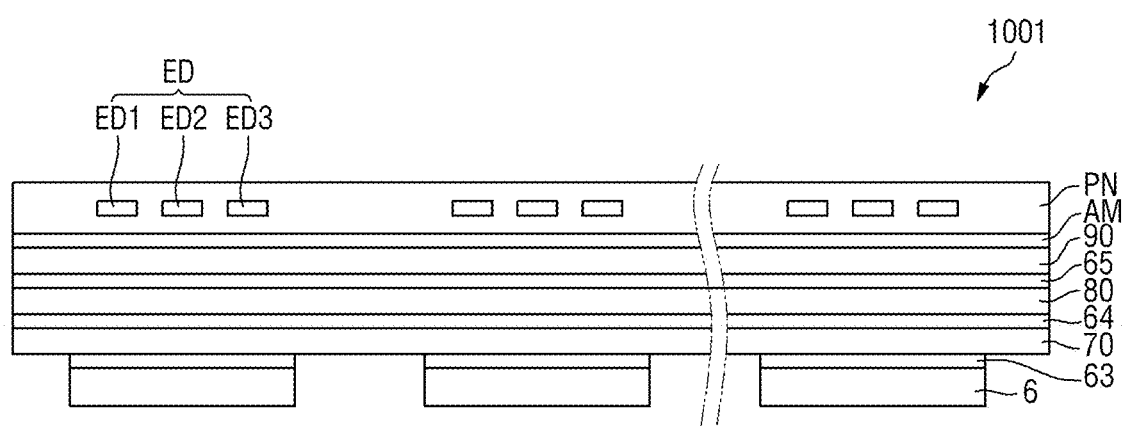
FIG. 25 is a cross-sectional view of yet another exemplary embodiment of a display device constructed according to principles of the invention.

FIG. 25 is a cross-sectional view of yet another exemplary embodiment of a display device constructed according to principles of the invention.

Referring to FIG. 25, a display device 1001 differs from the display device 1000 in that the display device 1001 includes a plurality of heat dissipation composites 6 that are disposed to be spaced apart from each other. In more detail, the display device 1001 may include a plurality of heat dissipation composites 6, which are disposed to be spaced apart from each other.

The heat dissipation composite 6 may be disposed in a portion (or region) in which a relatively large amount of heat is generated on the display panel PN of the display device 1001, and the heat dissipation composite 6 may not be disposed in a portion (or region) in which a relatively small amount of heat is generated on the display panel PN.

That is, the heat dissipation composites 6 may be formed in a patterned manner, rather than in an integrated manner as shown in FIG. 25, so as to secure a degree of freedom in arranging the heat dissipation composites 6. In this manner, it may be possible to reduce material consumption of the heat dissipation composite by arranging the heat dissipation composites 6 in necessary parts with intention.

Figure 26:
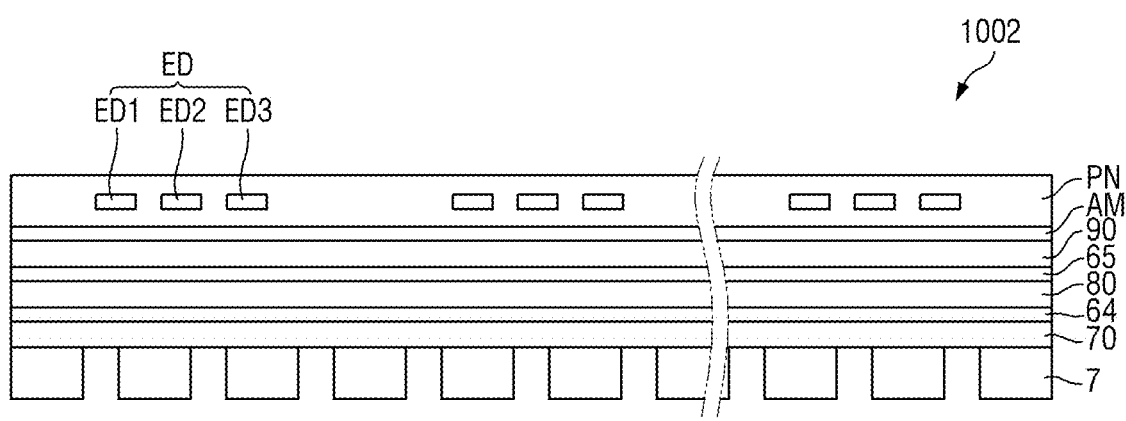
FIG. 26 is a cross-sectional view of still yet another exemplary embodiment of a display device constructed according to principles of the invention.

FIG. 26 is a cross-sectional view of still yet another exemplary embodiment of a display device constructed according to principles of the invention.

Referring to FIG. 26, a display device 1002 differs from the display device 1000 of FIG. 21 in that the display panel PN includes a central portion and a peripheral portion surrounding the central portion and the arrangement density of a plurality of heat dissipation composites 7 decreases as it goes from the peripheral portion to the central portion.

In more detail, the display panel PN of the display panel 1002 may include a central portion and a peripheral portion surrounding the central portion and the arrangement density of the plurality of heat dissipation composites 7 may decrease as it goes from the peripheral portion to the central portion.

According to this exemplary embodiment, it may be possible to increase the arrangement density of the heat dissipation composites 7 in the area (e.g., peripheral portion of the display panel PN) to increase the amount of heat release from the display panel PN of the display device 1002. In this manner, it may be possible to reduce the material consumption of the heat dissipation composite by arranging the heat dissipation composites 7 according to the intended use.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A heat dissipation composite for a display device, the heat dissipation composite comprising:
   a heat absorber;
   a plurality of electricity generators configured to convert heat from the heat absorber into electricity; and
   a vibrator disposed on the plurality of electricity generators to convert the electricity provided from the plurality of electricity generators into vibration,
   wherein:
   the vibrator has a generally mesh shape including a plurality of open portions;
   the plurality of electricity generators are disposed in the plurality of open portions; and
   a side surface of each of the plurality of electricity generators is in contact with an inner sidewalls of each of the plurality of open portions.

2. The heat dissipation composite of claim 1, wherein the heat dissipation composite has a convective heat transfer coefficient equal to or greater than about 70 $W/m^2K$.

3. The heat dissipation composite of claim 1, wherein the heat dissipation composite has a thickness equal to or smaller than about 1 mm.

4. The heat dissipation composite of claim 1, wherein the heat absorber is disposed on a different layer from the plurality of electricity generators.

5. The heat dissipation composite of claim 1, wherein each of the plurality of electricity generators is disposed on the same layer as the vibrator, and is surrounded by the vibrator.

6. The heat dissipation composite of claim 1, wherein the heat absorber comprises a graphite sheet.

7. The heat dissipation composite of claim 1, wherein each of the plurality of electricity generators comprises bismuth telluride.

8. The heat dissipation composite of claim 1, wherein the vibrator comprises a quartz, a potassium sodium tartrate, a titanium acid barium, an ammonium dihydrogen phosphate, or an ethylenediamine tartrate.

9. A display device comprising:
a display panel including a plurality of light emitting elements; and
a lower panel disposed on the display panel and including a heat dissipation composite,
wherein;
the heat dissipation composite comprises:
a heat absorber;
a plurality of electric generators configured to convert heat provided from the heat absorber into electricity; and
a vibrator disposed on the plurality of electric generators to convert the electricity provided from the plurality of electric generators into vibration;
the vibrator has a generally mesh shape including a plurality of open portions;
the plurality of electricity generators are disposed in the plurality of open portions; and
a side surface of each of the plurality of electricity generators is in contact with an inner sidewalls of each of the plurality of open portions.

10. The display device of claim 9, wherein the heat dissipation composite has a convective heat transfer coefficient equal to or greater than about 70 W/m$^2$K.

11. The display device of claim 9, wherein the heat dissipation composite comprises a plurality of heat dissipation composites spaced apart from each other.

12. The display device of claim 11, wherein the display panel includes a central portion and a peripheral portion surrounding the central portion, and
the plurality of heat dissipation composites has an arrangement density that decreases in a direction from the peripheral portion to the central portion.

13. The display device of claim 9, wherein:
the heat absorber comprises a heat dissipation layer, each of the plurality of electricity generators comprises a thermoelectric element layer, and the vibrator comprises a piezoelectric element layer; and
the heat dissipation layer is disposed on a separate layer from the thermoelectric element layer.

14. The display device of claim 9, wherein the lower panel comprises a lower panel sheet including a buffer member disposed between the heat absorber and the display panel, and a light blocking layer disposed between the buffer member and the display panel.

* * * * *